US007049033B2

United States Patent
Stearns et al.

(10) Patent No.: US 7,049,033 B2
(45) Date of Patent: May 23, 2006

(54) EUV LITHOGRAPHY RETICLES FABRICATED WITHOUT THE USE OF A PATTERNED ABSORBER

(75) Inventors: Daniel G. Stearns, Los Altos, CA (US); Donald W. Sweeney, San Ramon, CA (US); Paul B. Mirkarimi, Sunol, CA (US)

(73) Assignee: The EUV LLC, Santa Clara, CA (US)

( * ) Notice: Subject to any disclaimer, the term of this patent is extended or adjusted under 35 U.S.C. 154(b) by 282 days.

(21) Appl. No.: 10/631,359

(22) Filed: Jul. 31, 2003

(65) Prior Publication Data

US 2004/0142250 A1 Jul. 22, 2004

Related U.S. Application Data

(63) Continuation of application No. 09/752,887, filed on Dec. 28, 2000, now Pat. No. 6,635,391.

(51) Int. Cl.
*G03F 9/00* (2006.01)
*A61N 5/00* (2006.01)
*G03B 27/00* (2006.01)

(52) U.S. Cl. .......................... 430/5; 250/492.3; 355/18
(58) Field of Classification Search .................. 430/5; 250/492.3; 355/18; 378/34, 35
See application file for complete search history.

(56) References Cited

U.S. PATENT DOCUMENTS 5,399,448 A * 3/1995 Nagata et al. ................. 430/5
6,319,635 B1 * 11/2001 Mirkarimi et al. ............ 430/5
6,635,391 B1 * 10/2003 Stearns et al. ................ 430/5

FOREIGN PATENT DOCUMENTS

EP 0279670 A * 8/1988

* cited by examiner

*Primary Examiner*—Saleha R. Mohamedulla
(74) *Attorney, Agent, or Firm*—John P. Wooldridge; Alan H. Thompson

(57) ABSTRACT

Absorber material used in conventional EUVL reticles is eliminated by introducing a direct modulation in the complex-valued reflectance of the multilayer. A spatially localized energy source such as a focused electron or ion beam directly writes a reticle pattern onto the reflective multilayer coating. Interdiffusion is activated within the film by an energy source that causes the multilayer period to contract in the exposed regions. The contraction is accurately determined by the energy dose. A controllable variation in the phase and amplitude of the reflected field in the reticle plane is produced by the spatial modulation of the multilayer period. This method for patterning an EUVL reticle has the advantages (1) avoiding the process steps associated with depositing and patterning an absorber layer and (2) providing control of the phase and amplitude of the reflected field with high spatial resolution.

14 Claims, 3 Drawing Sheets

EUV LITHOGRAPHY RETICLES FABRICATED WITHOUT THE USE OF A PATTERNED ABSORBER

This is a Continuation of U.S. patent application Ser. No. 09/752,887, now U.S. Pat. No. 6,635,391, titled "A Method For Fabricating Reticles For EUV Lithography Without The Use Of A Patterned Absorber" filed Dec. 28, 2000, incorporated herein by reference.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the production of reticles for extreme ultraviolet lithography, and more specifically, it relates to systems and methods for directly writing patterns onto the reflective multilayer coating of an extreme ultraviolet lithography reticle.

2. Description of Related Art

The standard reflective reticle blank for extreme ultraviolet lithography (EUVL) consists of a thick substrate coated with a reflective multilayer film. The reflective multilayer coating may consist of any of several different material combinations. The industry standard is 40 layer pairs of molybdenum and silicon. Each layer pair has a thickness of about 7 nm. To fabricate the EUVL reticle, a buffer-layer film of thickness 50–100 nm plus an absorber film of thickness between 50 and 150 nm is deposited on the multilayer reflective coating and subsequently patterned. The buffer-layer typically consists of $SiO_2$, and is used to protect the multilayer during patterning and serves as a sacrificial layer for the repair of absorber defects. Absorber materials such as Al, Cr or TiN produce a binary modulation of the reflected field according to the spatial pattern to generate the desired lithographic image. There are significant costs and issues associated with this process. For example, the buffer-layer film needs to be of sufficient thickness to protect the multilayer, but as the (transparent) buffer-layer thickness increases the absorber is placed higher above the multilayer surface. For extreme ultraviolet (EUV) light incident on the multilayer film at angles away from normal incidence, this results in reflected EUV tight escaping from the multilayer where it typically would be caught by the absorber.

Reticles for EUV lithography other than the one discussed above have also been proposed. One design uses a patterned multilayer film, where the non-reflecting substrate effectively acts as the absorber. There are disadvantages with this approach, including the sharpness of the absorber edges that are produced. Another EUVL reticle proposal is to use a focused beam to pattern a multilayer-coated reticle by destroying the reflectance of the multilayer in the areas that are exposed to the beam. The main disadvantage of this approach is the difficulty in confining the affected region to a small area considering the significant damage that must be done to make the multilayer non-reflecting.

U.S. Pat. No. 5,521,031, titled "Pattern Delineating Apparatus for use in the EUV spectrum" proposes a variant on the standard EUVL reticle. The patent incorporates the basic principles of an attenuated phase shift reticle in a reflecting structure. This allows a small amount of EUV light to be reflected from absorber layers, where the EUV light is phase shifted by 180° relative to the reflective multilayer. This allows for an increase in the sharpness of the EUV light intensity modulation at the wafer plane, and hence greater resolution.

It is desirable to eliminate the absorber material from an EUVL reticle by introducing a direct modulation in the complex-valued reflectance of an EUVL reticle thin film multilayer.

SUMMARY OF THE INVENTION

It is an object of the present invention to provide a method and apparatus for producing a direct modulation in the complex-valued reflectance of the thin film multilayer of an EUVL reticle.

It is another object to provide a spatially localized energy source such as a focused electron or ion beam to directly writes a reticle pattern onto the reflective multilayer coating.

Still another object of the invention is to directly write a reticle pattern onto the reflective multilayer coating by activating interdiffusion within the film by an energy source that causes the multilayer period to contract in the exposed regions.

These and other objects will be apparent to those skilled in the art based on the disclosure herein.

The present invention eliminates the absorber material from an EUVL reticle by introducing a direct modulation in the complex-valued reflectance of the multilayer. The reticle pattern is directly written onto the reflective multilayer coating with a spatially localized energy source such as a focused electron or ion beam. The energy source activates interdiffusion within the film that causes the multilayer period to contract in the exposed regions. The contraction is accurately determined by the energy dose. The spatial modulation of the multilayer period produces a controllable variation in the phase and amplitude of the reflected field in the reticle plane. This method for patterning an EUVL reticle has the advantages of (1) avoiding the process steps associated with depositing and patterning an absorber layer and (2) providing control of the phase and amplitude of the reflected field with high spatial resolution.

This invention has the potential to impact the extreme ultraviolet lithography (EUVL) system currently under development at Lawrence-Livermore National Laboratory (LLNL). In addition to strong commercial applications (see below), EUVL has the potential to impact government programs such as ASCII.

There is a strong commercial driving force for increased miniaturization in electronic devices, and hence an extreme ultraviolet lithography (EUVL) tool has significant commercial potential. For EUVL to be commercially viable the cost of ownership must be reasonable, and one of the more expensive components is the EUVL reticle. This invention reduces the cost of EUVL reticles by eliminating the need for patterned absorber layers on the multilayer-coated reticles

DETAILED DESCRIPTION OF THE INVENTION

Figure 1A:
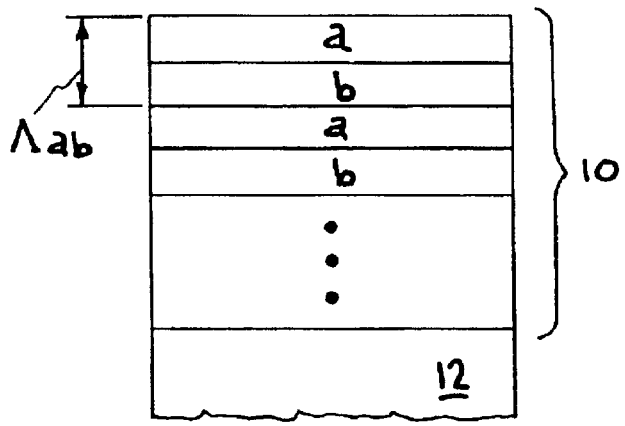
FIG. 1A shows a typical prior art reticle blank.
Figure 1B:
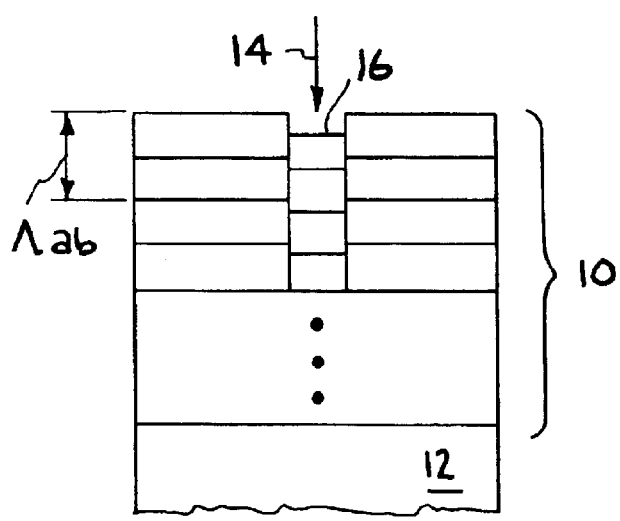
FIG. 1B shows a reticle blank after processing with a localized energy source.
Figure 1C:
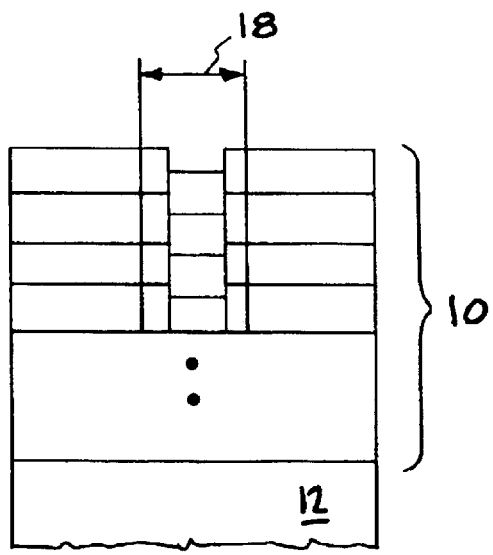
FIG. 1C illustrates the effective resolution element.

This invention eliminates the need for an absorber material in reticles for extreme ultraviolet lithography (EUVL) by introducing a direct modulation in the complex-valued reflectance of the multilayer. The reticle pattern is directly written onto the reflective multilayer coating with a spatially localized energy source such as a focused electron or ion beam. FIG. 1A shows a typical prior art reticle blank consisting of an A/B multilayer film 10 on a substrate 12, and FIG. 1B shows a reticle blank after processing with a localized energy source, which is a focused beam in this example. The focused beam 14 activates interdiffusion within the film 16 that causes the multilayer period to contract in the exposed regions. The contraction is accurately determined by the energy dose. The spatial modulation of the multilayer period produces a controllable variation in the phase and amplitude of the reflected field in the reticle plane. In an A/B multilayer-coated EUVL reticle blank, adjacent multilayer regions have the potential to reflect EUV light that will destructively interfere at the wafer plane if the EUV light reflected from a given region on the multilayer is 180° out of phase with the light reflected from adjacent regions on the multilayer. A 180° phase shift can be achieved by a suitable contraction of the multilayer. This contracted area coupled with adjacent uncontracted areas of the multilayer form the effective resolution element, since in the wafer plane, it will appear that there is no net EUV light reflected from this area of the reticle (due to destructive interference). This is the region that would be covered by an absorber film in a conventional reticle. The effective resolution element 18 is illustrated schematically in FIG. 1C.

The method described here for patterning an EUVL reticle has the advantages of (i) eliminating the need to deposit and pattern an absorber layer, (ii) providing control of the phase and amplitude of the reflected field, and (iii) eliminating the need for a buffer-layer, which can result in undesirable reflections. This reticle design also incorporates the primary benefit of an attenuated phase shift reticle in that arbitrary control of the phase of the reflected light should allow for an increase in the sharpness of the EUV light intensity modulation at the wafer plane, and hence greater resolution. This method also has an advantage over the alternative reticle design in which focused beams are used to selectively destroy the reflectivity of the multilayer to create a patterned reticle. The advantage is that in order to affect a minor contraction in the multilayer, much less energy has to be deposited with the present invention. This should: (i) make it possible to provide better spatial confinement of the beam, resulting in finer absorber lines being possible and (ii) make for a faster patterning process.

In contracting the multilayer, there are two reasons why the phase will change relative to an adjacent, uncontracted region of the multilayer. The phase will change because (i) the height of the multilayer stack is decreased, and hence the EUV light will transverse a larger path relative to the uncontracted multilayer, and (ii) to contract the multilayer stack there must be a small decrease in Λ (one bi-layer period thickness) which will also result in a change in phase. To achieve a 180° phase shift, the contraction in the height of the multilayer stack will need to be approximately one bi-layer period thickness, Λ. This is because the phase shift due to the decreased bi-layer period is approximately one half of the phase shift due to the change in the height of the multilayer stack, and is of the opposite sign (Reference: D. G. Stearns, R. S. Rosen and S. P. Vernon, in "Short-Wavelength Coherent Radiation: Generation and Applications", Vol. 11 of 1991 OSA Technical Digest Series (Optical Society of America, Washington, D.C., 1991), p. 152). For a typical Mo/Si multilayer-coated reticle blank designed to reflect EUV light at 13.4 nm, this corresponds to a contraction of approximately 7 nm for the entire multilayer stack in the region of interest. Since the contraction can be shared among most, if not all of the bi-layers in the multilayer stack, Λ would need to contract by approximately 0.2 nm. This would translate to the wavelength of the reflectance peak being shifted by approximately 0.4 nm relative to the uncontracted region, which is less than the full-width-at-half-maximum (FWHM) of the Mo/Si reflectance peak, which is typically 0.55 nm. This is important since if the difference in the wavelength of the reflected light from the contracted and uncontracted regions, Δλ, equals or exceeds the FWHM of the multilayer reflectance peak, then the amplitude of the reflected field is reduced. Then both phase and amplitude modulation can be achieved with this invention by controlling the amount of film contraction. The use of the materials of Mo/Si is presented as an example. Other multilayer combinations would work equally well with the techniques presented herein. The equations, dosages, etc., would have to change and/or be optimized, but the technique for adjusting such for the different film pairs is as disclosed.

It should also be noted that binary contrast (completely white or black resolution elements) is usually not necessary or desirable. Therefore contractions in the multilayer stack of less than 7 nm are effective, which may be advantageous since it requires smaller changes in Λ and hence lower Δλ.

Figure 2:
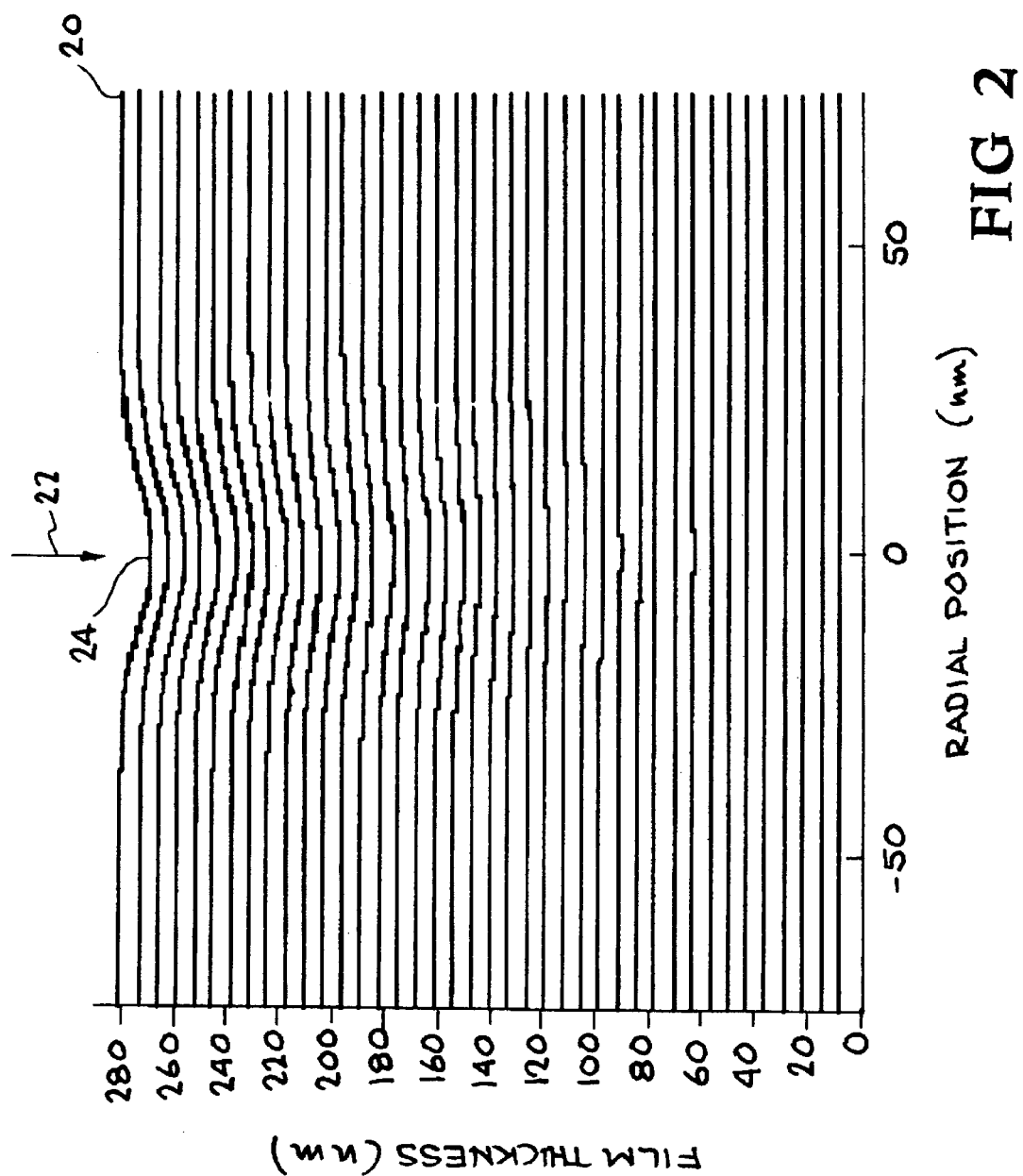
FIG. 2 shows the results of a finite element simulation of the deformation of a Mo/Si multilayer film produced.
Figure 3:
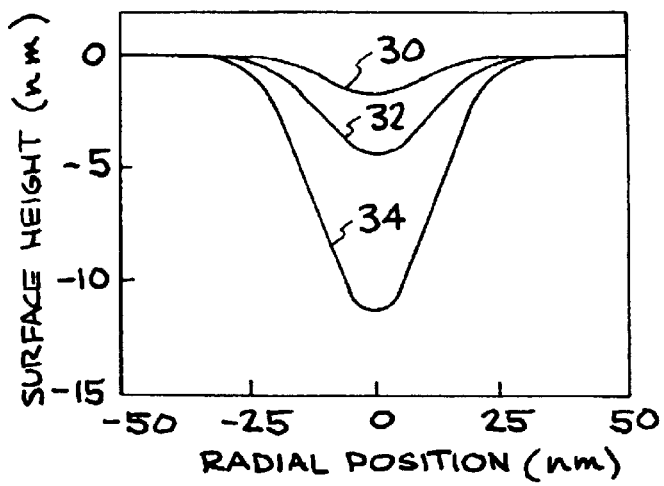
FIG. 3 illustrates that the size of a depression at the multilayer surface can be controlled by controlling the exposure time.

In order to assess the viability of the present invention, finite element simulations were performed for the case of an electron beam impinging on a localized area of a Mo/Si multilayer film. The local contraction of the multilayer period due to silicide formation will produce an indentation in the film in the vicinity of the electron beam. FIG. 2 shows the results of a finite element simulation of the deformation 24 of a Mo/Si multilayer film 20 produced by a 10 msec exposure to an electron beam 22 of radius 25 nm, energy 10 kV, and current 3 µA. The depression 24 at the surface is 12 nm, yet the contraction of each multilayer period is only 0.5 nm. The size of the depression at the surface can be controlled by controlling the exposure time, as shown in FIG. 3. The lines at 30, 32 and 34 represent exposure times of 1 ms, 3 ms and 10 ms respectively. More information on these simulations is described below.

More specifically, finite element analysis was used to simulate the temperature increase in a Mo/Si multilayer film due to the injection of current by an electron beam. The Mo/Si multilayer film was modeled in cylindrical coordinates (2D) as a disk of thickness 280 nm and radius 10 µm on a Si substrate of thickness 1.12 µm. The multilayer film, which actually is composed of 40 Mo/Si periods each having a thickness of 7.0 nm, was treated as a single isotropic film for the purpose of the FEM modeling. The material prop erties of the Mo/Si film and the Si substrate are listed in Table I.

TABLE I

Values for the thermal conductivity κ, the mass density ρ, the specific heat $c_p$ and the conductivity σ used in the FEM modeling.

| Material | κ (W/cm-° K.) | ρ (gm/cm³) | $c_P$ (J/gm-° K.) | σ (1/Ω-cm) |
|---|---|---|---|---|
| Mo/Si ML Film | 1.45 | 5.48 | 0.53 | 1 × 10⁴ |
| Si substrate | 1.49 | 2.33 | 0.71 | 1 |

The time-dependent temperature profile T(r,z;t) within the multilayer film was determined by solving the thermal diffusion equation:

$$\frac{1}{r}\frac{\partial}{\partial r}\left(\kappa \frac{\partial T}{\partial r}\right) + \frac{\partial}{\partial z}\left(\kappa \frac{\partial T}{\partial z}\right) - \rho c_P \frac{\partial T}{\partial t} + H(r, z; t) = 0 \quad (1)$$

Here H is the heat source. The electron beam voltage was chosen to be sufficiently high (10 kV) so that the electron range would approximately match the thickness of the multilayer film. Then it was assumed that the energy was deposited uniformly through the film, within a cylinder of radius $r_0$=25 nm. (This oversimplified picture neglects the scattering of the electrons within the film, which could be significant). In this model the heat deposited by the electron beam per unit volume was given by, $$H = \frac{IV}{\pi r_0^2 \tau} \quad (2)$$

Here I and V are the respective current and voltage of the electron beam and τ is the thickness of the multilayer film.

The time required for heat to diffuse a distance x is given by $x^2 \rho c_p/\kappa$. Inserting the values from Table I, it is seen that heat diffuses a micron in 20 ns. Hence, over the physical dimensions of this problem, the transient temperature dependence only lasts for tens of nanoseconds. Since such short timescales are not of interest, Eq. (1) was simplified by dropping the dT/dt term and just solved for the steady state temperature profile. The boundary conditions used in the calculations were that the bottom and sides of the substrate and the sides of the multilayer film were maintained at a constant ambient temperature of 300° K. The top surface of the multilayer film was assumed to be thermally insulated (i.e., radiative cooling was neglected).

Figure 4:
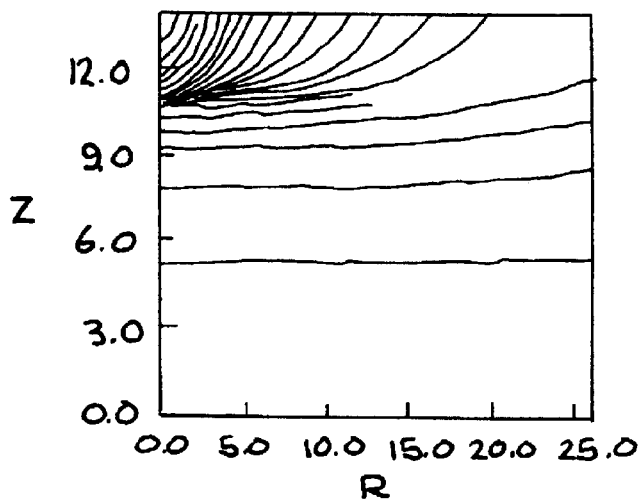
FIG. 4 shows the temperature profile obtained for an electron beam of current I=3 µA and voltage V=10 kV.
Figure 5:
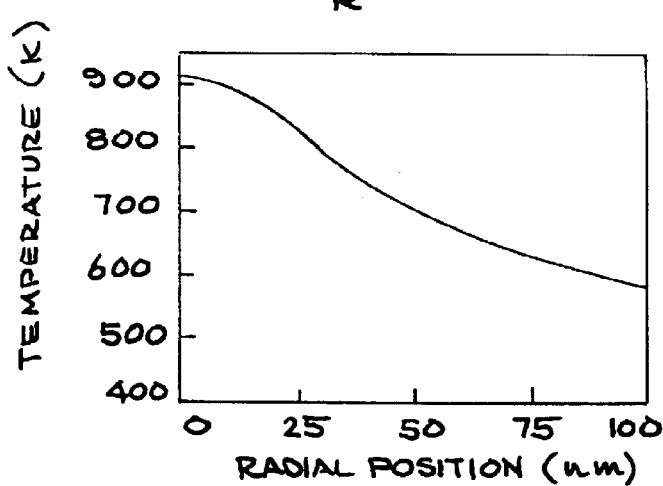
FIG. 5 is a plot of the temperature as a function of radial position on the top surface of the multilayer.

The current density was adjusted to produce peak temperatures sufficiently high (>800° K.) to activate the silicide formation that causes the contraction of the multilayer film. The temperature profile obtained for an electron beam of current I=3 μA and voltage V=10 kV is shown in FIG. 4. The temperature on the top surface is plotted in FIG. 5 as a function of radial position. The heating is fairly uniform in depth due to the penetration of the electron beam. FIG. 5 shows that the temperature falls off rapidly in the radial direction, reducing to 700° K. within 50 nm of the center of the electron beam.

Once the temperature profile is known, it is straightforward to calculate the contraction of the multilayer film due to silicide formation. The reaction of Mo and Si at the interfaces is rate limited by thermally activated interdiffusion (See "Silicide Layer Growth Rates in Mo/Si Multilayers", R. S. Rosen, D. G. Stearns, M. A. Viliardos, M. E. Kassner, S. P. Vernon and Y. Cheng, Appl. Optics 32, 6975 (1993), incorporated herein by reference.) The width of the interlayer increases with time according to:

$$w^2 = w_0^2 + 2Dt \quad (3)$$

Here $w_0$=1.0 nm is the starting thickness of the interlayers in as-deposited films. The interdiffusion coefficient D is given by, $$D = D_0 \exp(-E_A/kT) \quad (4)$$

Where $D_0$=50 cm²/s and $E_A$=2.4 eV for Mo/Si multilayer films. The formation of the silicide interlayer involves densification that leads to a contraction of the multilayer period. The local change in the period is given by, $$\Delta\Lambda = \Lambda_0 - \alpha(w - w_0) \quad (5)$$

Here α is the contraction factor that depends on the particular silicide compound that is formed. In this study, α=0.38 is used, which corresponds to the contraction that occurs upon the formation of $MoSi_2$.

The growth of the silicide interlayer has an approximately square root dependence on the time that the film is subjected to heating, which will be referred to as the exposure time. Note that because the thermal response is so rapid, the transient heating and cooling times can be neglected. The interlayer has a maximum thickness at the surface of the film in the center of the current injection (r=0), and is approximately twice as thick as the as-deposited interlayer. It is evident that the electron beam creates significant interlayer growth nearly half way through the entire thickness of the film. This is of course due to the penetration of the electron beam, and the fairly uniform heating through the thickness of the film. Because the interlayer growth is in an activated process, it is only significant in those regions reaching temperatures greater than ~800° K.

The local contraction of the multilayer period produces an indentation in the film in the vicinity of the electron beam. The structural deformation in the Mo/Si multilayer film resulting from a 10 ms exposure (I=3 μA, V=10 kV) is shown in FIG. 2. Although the depression at the surface is 12 nm deep, the contraction of each multilayer period, ΔΛ, is less than 0.5 nm. Consequently the primary effect of such a deformation on the EUV reflectivity of the multilayer film will be to cause a local phase perturbation. For larger deformations there will also be a decrease in the reflectivity due to the decrease in contrast at the multilayer interfaces. Note also that the lateral width of the deformation is contained within the region of the electron beam. The depth of the deformation is most easily controlled by adjusting the exposure time. Again, this is shown in FIG. 3, where the profile of the top surface of the film is plotted for exposure times of 1, 3 and 10 ms. It is apparent that by adjusting the exposure time and the footprint, the detailed shape of the deformation and the corresponding phase shift can be accurately controlled.

These results show that an electron beam of moderate voltage (~10 kV) can be used to contract the period of a Mo/Si reflective coating within a small spot defined basically by the footprint of the beam. (For Mo/Si, the key physical requirement on the energy deposition is the spatial resolution, i.e., small spot size, and energy sufficient to raise the temperature by hundreds of degrees. In the case of Mo/Si this works out to a deposited power in the range of 1–100 mW.) The contraction of the period, due to thermally activated silicide formation at the multilayer interfaces, occurs through approximately half the thickness of the film (20 periods). This produces a controllable indentation at the top surface having a depth that can exceed 10 nm. Since the film contraction generated by the electron beam is distributed over many periods, the primary effect of the deformation on the EUV reflectivity is a local phase shift of the reflected field.

The requirements of microamps of current at 10 kV are difficult to achieve within a spot size of ~50 nm. One solution is to use field emission from a carbon nanotube. These nanotubes are tens of nanometers in diameter and are stable, high current field emitters capable of delivering microamps of current (See A. G. Rinzler, J. H. Hafner, P. Nikolaev, L. Lou, S. G. Kim, D Tomanek, P. Nordlander, D. T. Colbert and R. E. Smalley, "Unraveling Nanotubes: Field Emission from an Atomic Wire", Science 269, 1550 (1995) incorporated herein by reference. The nanotube could be integrated into the head of a scanning probe microscope, and proximity focusing could be used to steer the extracted current into a small spot on the surface of the film. The scanning probe microscope can be used to locate and monitor the reticle fabrication process.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

We claim:

1. An apparatus, comprising an EUVL reticle that includes a substrate with a thin film multilayer coating having a complex-valued reflectance and multiple layer boundaries, wherein the thickness of said thin film multilayer coating has been changed by altering the density of at least one layer of said thin film multilayer coating to introduce a direct modulation in said complex-valued reflectance.

2. An apparatus, comprising an EUVL reticle that includes a substrate with a thin film multilayer coating having a complex-valued reflectance and multiple layer boundaries, wherein the thickness of said thin film multilayer coating has been changed by interdiffusing a plurality of layer boundaries of said multiple layer boundaries to introduce a direct modulation in said complex-valued reflectance, wherein the multilayer contraction associated with the densification that occurs upon interdiffusion at said multiple layer boundaries is controlled.

3. An apparatus, comprising an EUVL reticle that includes a substrate with a thin film multilayer coating having a complex-valued reflectance and multiple layer boundaries, wherein the thickness of said thin film multilayer coating is changed by interdiffusing at least one layer boundary of said multiple layer boundaries, wherein the multilayer contraction associated with the densification that occurs upon interdiffusion at said at least one layer boundary is controlled.

4. The apparatus of claim 3, wherein the multilayer contraction is controlled with a localized energy source for producing energy for activating said interdiffusion.

5. The apparatus of claim 4, wherein said localized energy source comprises an electron beam source for producing said energy in the form of an electron beam.

6. The apparatus of claim 5, further comprising means for focusing said electron beam.

7. The apparatus of claim 4, wherein said localized energy source is selected from the group consisting of an electromagnetic beam source, an electron beam source and an ion beam source.

8. The apparatus of claim 7, further comprising means for focusing said energy.

9. The apparatus of claim 4, wherein said localized energy source comprises an electrode.

10. The apparatus of claim 3, wherein said thin film multilayer coating comprises Mo/Si.

11. The apparatus of claim 7, further comprising means for adjusting the energy dose of said localized energy source for controlling the decrease in thickness of said multilayer coating.

12. The apparatus of claim 7, further comprising means for adjusting the energy dose of said localized energy source to control the decrease in film thickness with sub-nanometer accuracy.

13. The apparatus of claim 7, further comprising means for controlling the lateral spatial resolution of the localization of energy deposition produced by said localized energy source.

14. The apparatus of claim 4, further comprising means for adjusting the exposure time of said localized energy source for controlling the depth of the deformation.

* * * * *